(12) United States Patent
Yeates et al.

(10) Patent No.: US 7,638,717 B1
(45) Date of Patent: Dec. 29, 2009

(54) CAN SPRING HOUSING CONTACT

(75) Inventors: Kyle Yeates, Palo Alto, CA (US); Scott Myers, San Francisco, CA (US); Teodor Dabov, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/186,995

(22) Filed: Aug. 6, 2008

(51) Int. Cl.
 *H05K 9/00* (2006.01)
(52) U.S. Cl. .................. 174/382; 174/377; 174/384; 361/816
(58) Field of Classification Search .......... 174/377, 174/382, 384; 361/816, 818, 800
See application file for complete search history.

(56) References Cited

U.S. PATENT DOCUMENTS

| | | | | |
|---|---|---|---|---|
| 4,754,101 A | * | 6/1988 | Stickney et al. | 174/383 |
| 6,121,504 A | * | 9/2000 | Kuechler et al. | 585/640 |
| 6,377,472 B1 | * | 4/2002 | Fan | 361/800 |
| 6,674,653 B1 | * | 1/2004 | Valentine | 361/818 |
| 7,109,411 B2 | * | 9/2006 | Vinokor et al. | 174/350 |
| 7,177,161 B2 | * | 2/2007 | Shima | 361/816 |
| 7,259,969 B2 | * | 8/2007 | Zarganis et al. | 361/800 |
| 2001/0033478 A1 | * | 10/2001 | Ortiz et al. | 361/818 |
| 2005/0018411 A1 | * | 1/2005 | Lum et al. | 361/800 |

\* cited by examiner

*Primary Examiner*—Hung V Ngo
(74) *Attorney, Agent, or Firm*—Kramer Levin Naftalis & Frankel LLP

(57) ABSTRACT

An electromagnetic interference (EMI) shield is provided. The EMI shield may include a frame and a cover operative to be placed over the frame. The cover may include snaps or tabs extending from the surface of the cover and operative to engage side walls of the frame. At least one edge of the cover, for example an edge operative to be placed near an electronic device housing, may not include snaps or tabs to reduce the size of the EMI shield near the housing. Instead, the frame may include one or more stepped returns, the top-most of which may be operative to be placed in contact with the cover. The cover may include a spring, an emboss and one or more grounding points to ensure that the cover remains in contact with the frame despite the absence of snaps or tabs securing the cover to the frame.

19 Claims, 2 Drawing Sheets

CAN SPRING HOUSING CONTACT

BACKGROUND OF THE INVENTION

This invention is directed to an electromagnetic interference (EMI) shield for use in an electronic device.

Many electronic devices include various electronic components that emit electromagnetic radiation. To prevent disturbances of the electronic components, EMI shields may be provided in the electronic device. For example, the electronic device components may be placed in a conductive enclosure (e.g., a metallic box) that prevents radiation from escaping the box. As another example, the enclosure in which the electronic components are placed may be coated with a metallic or conductive paint. The enclosure may be formed by providing a frame over which a cover having vertically extending tabs is placed. The tabs may engage side walls of the frame around the periphery of the frame to ensure that the enclosure is secure.

When used in devices with curved housings, or when placed against curved surfaces, these shields may cause significant space to be lost. For example, when a corner of an enclosure (e.g., where a cover has a snap extending away from the cover to engage a frame wall) is placed against a curved housing, space may be lost around the corner to accommodate the entire housing. In particular, the housing may need to be enlarged to wrap around the enclosure, thus increasing the electronic device size. Furthermore, the size of components to be protected by the EMI shield may prevent the size of the enclosure from being reduced to accommodate the curved housing. There is a need, therefore, to provide an EMI shield that can substantially follow or accommodate a curved housing while retaining suitable EMI protection.

SUMMARY OF THE INVENTION

An EMI shield for protecting components of an electronic device from electromagnetic interferences is provided.

The EMI shield may include a frame operative to be coupled to a circuit board and a cover operative to be placed over the frame. The electronic device components in need of EMI protection may be placed within the boundary defined by the frame. The frame may include a side wall extending from the surface of the circuit board, and a return extending substantially parallel to the circuit board and over the surface enclosed by the frame.

In portions of the frame operative to be placed against or adjacent to a curved housing or other curved electronic device component that restricts the size of the EMI shield, the single return may be replaced by several returns offset at different heights and the side wall height may in addition be reduced. For example, the return may be stepped such that several returns, having the same or different dimensions, may be staggered in distance from the circuit board (e.g., along a z-axis) to form steps substantially following the shape of the curved housing or other component.

The cover may include a substantially planar surface and several tabs or snaps extending substantially perpendicular to the planar surface. The cover may be placed over the frame such that the planar surface is substantially bound by the periphery of the frame and the snaps overlap and engage the side walls of the frame (e.g., using one or more snapping mechanisms or any other suitable engagement mechanism). To reduce the space taken by the EMI shield, and in particular to limit the amount of the cover placed along the portions of the EMI shield that are adjacent to the housing (e.g., where the frame includes a stepped return), the cover may not include any snaps along the edge of the cover aligned with the stepped return.

Instead, the cover may include a spring (e.g., a cantilever spring) extending from the surface of the planar surface in a direction opposite the snaps and operative to be placed in contact with the curved housing when the electronic device is assembled. The contact between the spring and the housing may provide a force operative to hold the cover against the frame despite the absence of snaps engaging the side walls of the frame. To distribute the force from the spring along the edge of the cover, the cover may include an emboss or other feature operative to distribute the force. The emboss may be designed to distribute the spring force in any suitable manner, for example to one or more specific points of the cover.

The cover may include, along the portion of the planar surface in contact with the top-most stepped return, one or more grounding points (e.g., embossed features) operative to engage or contact one or more corresponding indentations or other features of the stepped return. The emboss may distribute the spring force to the grounding points to ensure that the grounding points always remain in contact with the frame, thus ensuring that the EMI shield remains grounded and operational.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
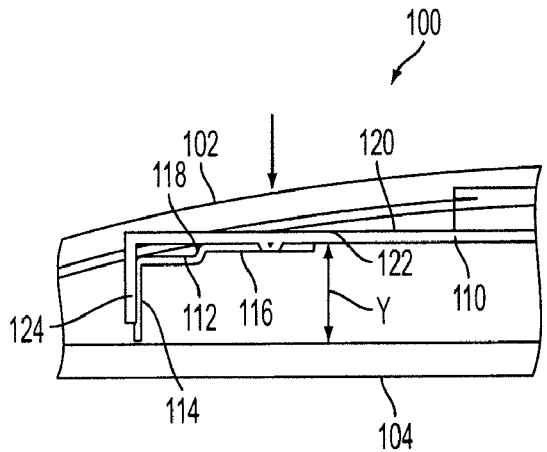
FIG. 1 is a cross-section of an illustrative EMI shield used in an electronic device in accordance with one embodiment of the invention.

FIG. 1 is a cross-section of an illustrative EMI shield used in an electronic device in accordance with one embodiment of the invention. Electronic device 100 may include housing 102 forming an outer surface of the device. To protect electronic device components (e.g., coupled to circuit board 104) stored within housing 102 from electromagnetic interference, electronic device 100 may include EMI shield 110, which may be formed from frame 112 over which cover 120 may be placed. Frame 112 may include side walls 114 and upper lip or return 116. Side wall 114 may be coupled to circuit board 104 to form the side walls of a box (e.g., enclosing electronic device components). Side wall 114 may be coupled to circuit board 104 using any suitable approach, including for example soldering, snapping or clipping into a structural element of circuit board 104 (e.g., snaps extending in apertures in the circuit board, or snaps coupling to a receiving element incorporated in the circuit board), an adhesive or tape, or any other suitable approach.

Cover 120 may include planar surface 122 operative to extend over the area defined by side wall 114. Cover 120 may include walls or snap 124 extending vertically from at least a portion of the periphery of surface 120 to engage side wall 114 of frame 110. The combination of circuit board 104, frame 110 and cover 120 may form a box in which electronic components may be isolated and shielded from electromagnetic radiation.

Figure 2:
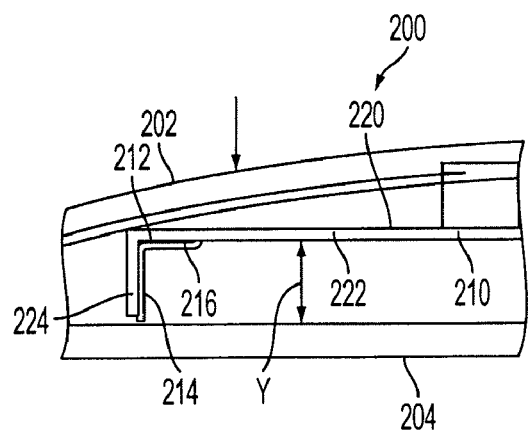
FIG. 2 is a cross-section of another illustrative EMI shield used in an electronic device in accordance with one embodiment of the invention.

FIG. 2 is a cross-section of another illustrative EMI shield used in an electronic device in accordance with one embodiment of the invention. Electronic device 200 may include housing 202 forming an outer surface of the device. To protect electronic device components (e.g., coupled to circuit board 204) stored within housing 202 from electromagnetic interference, electronic device 200 may include EMI shield 210, which may be formed from frame 212 over which cover 220 may be placed. Frame 212 may include side walls 214 and upper lip or return 216. Side wall 214 may be coupled to circuit board 204 to form the side walls of a box (e.g., enclosing electronic device components). Side wall 214 may be coupled to circuit board 204 using any suitable approach, including for example soldering, snapping or clipping into a structural element of circuit board 204 (e.g., snaps extending in apertures in the circuit board, or snaps coupling to a receiving element incorporated in the circuit board), an adhesive or tape, or any other suitable approach.

Cover 220 may include planar surface 222 operative to extend over the area defined by side wall 214. Cover 220 may include walls or snap 224 extending vertically from at least a portion of the periphery of surface 220 to engage side wall 214 of frame 210. The combination of circuit board 204, frame 210 and cover 220 may form a box in which electronic components may be isolated and shielded from electromagnetic radiation.

When EMI shields 110 and 210 are located near housing 102 and 202, respectively, the shape of the housing may provide constraints to the size and shape of the frame and cover of the EMI shields. This may be particularly true when housing 102 includes a curved surface. For example, if EMI shield 110 maintains a high height (e.g., to accommodate tall or large components coupled to board 104), cover 120, and in particular portions of cover 120 adjacent to the periphery of surface 122 from which snap 124 extends may abut housing 102 and prevent electronic device 100 from being assembled properly.

Alternatively, if the height of EMI shield 210 is reduced to allow housing 202 to be properly assembled to other electronic device components, components coupled to circuit board 204 may not fit beneath cover 220. In particular, as can be seen by comparing FIGS. 1 and 2, the height Y in FIG. 2 is less than the height Y in FIG. 1 by a value at least equal to the height of secondary return 118 of frame 112.

Figure 3:
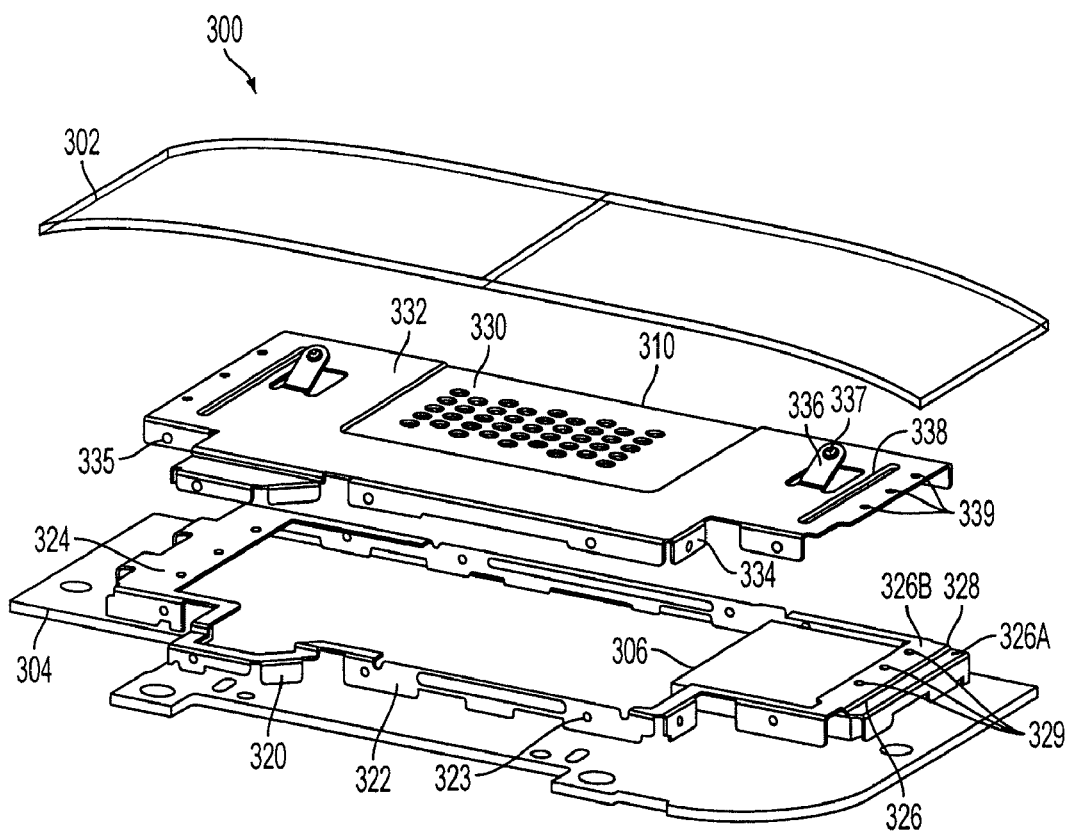
FIG. 3 is an exploded view of an electronic device having a modified EMI shield in accordance with one embodiment of the invention.

To accommodate curved housings while maintaining sufficient height between the circuit board (e.g., circuit board 104) and the housing (e.g., housing 102), the design of the EMI shield (e.g., EMI shield 110) must be modified. FIG. 3 is an exploded view of an electronic device having a modified EMI shield in accordance with one embodiment of the invention.

Electronic device 300 may include housing 302 and circuit board 304. Electronic device component 306 may be coupled to circuit board 304. Housing 302 may include a curved surface such that a standard EMI shield design having a cover overlapping the sides of a frame is not suitable.

Electronic device 300 may include EMI shield 310, which may be constructed by combining can or frame 320 with cover 330. EMI shield 310 may have any suitable shape (e.g., any suitable footprint on circuit board 304), including for example a shape driven or determined by the electronic device components to be placed within EMI shield 310. Frame 320 may include side walls 322 and upper lip or return 324. Side walls 322 may extend partially or entirely around the periphery of frame 320 and may be coupled to circuit board 304 to form the side walls of a box (e.g., enclosing electronic device components such as component 306). Side walls 324 may be coupled to circuit board 304 using any suitable approach, including for example soldering, snapping or clipping into a structural element of circuit board 304 (e.g., snaps extending in apertures in the circuit board, or snaps coupling to a receiving element incorporated in the circuit board), an adhesive or tape, or any other suitable approach.

In some embodiments, portions of frame 320 near a curved surface of housing 302 (e.g., portions of frame 320 that would otherwise come into contact with housing 302) may include a stepped return 326. For example, stepped return 326 may include first and second returns 326A and 326B having different heights from circuit board 304 and offset to roughly follow the curved shape of housing 302 (e.g., the distance of the leading/inner or trailing/outer edge of each of returns 326A and 326B to wall 322 is different). The width of each return 326A and 326B, as well as the height 328 between each return, may be selected based on any suitable criteria, including for example the component underneath the return, the shape or curvature of housing 302, structural limitations of frame 302, or any other suitable criteria. Stepped return 326 may include any suitable number of consecutive returns having any suitable width and offset by any suitable height.

One or more of stepped returns 326 may include one or more indentations 329 for grounding cover 330. For example, cover 330 may include an element (described below) operative to engage indentations 329 to ensure that cover 330 and EMI shield 310 remains grounded (e.g., because no snap of cover 330 engages frame 320 in locations adjacent to stepped return 326). In the example of FIG. 3, only top-most stepped return 326B includes indentations 329. It will be understood, however, that any other stepped return 326 or ordinary return 324 may include indentations 329.

Cover 330 may include planar surface 332 operative to extend over the area defined by frame 320. Cover 330 may include walls or snap 334 extending vertically from at least a portion of the periphery of surface 332 to engage side walls 322 of frame 320. For example, cover 330 may include snaps 334 operative to engage side walls 322 that are not adjacent to stepped return 326.

Cover 330 may be coupled to frame 320 using any suitable approach. In some embodiments, snaps 334 may be substantially aligned with side walls 322 such that the snaps may engage a portion of the side walls. Snaps 334 may include one or more mechanisms for engaging side walls 322. For example, snaps 334 may be elastically biased towards side walls 322 such that snaps 334 may deflect when they are placed over frame 320, thus creating an interference or frictional fit. As another example, snaps 334 may include a tab or protrusion 335 operative to engage a corresponding indentation, aperture or tab 323 in the side wall. As still another example, a tape, adhesive or mechanical fastener (e.g., a screw passing through snaps 334 and engaging side wall 322) may be used to secure snaps 334 to frame 320.

Cover 330 may include any suitable number of snaps 324. For example, cover 330 may include snaps 334 offset at distances larger than the width of a snap. In some embodiments, different snaps 334 may have different sizes, for example based on the component 306 lying adjacent to the snap on circuit board 304, or based on the position of snap relative frame 320 (e.g., a snap adjacent to a corner may be wider than a snap in the middle of a wall). The snaps may also be distributed along the periphery of the cover using any suitable approach, including for example evenly, or based on the EMI shielding or structural requirements of the shield.

In some embodiments, portions of cover 330 may not include snaps 334. For example, portions of cover 330 operative to be placed over or adjacent to stepped return 326 may not include snaps 334, but may instead simply end at the boundary of the top-most stepped return (e.g., stepped return 326B). By not including additional material to be placed over side walls 322 near the stepped return, the thickness of EMI shield 310 along the portion of EMI shield 310 that is in closest contact with housing 302 (e.g., due to the curvature of housing 302) may be reduced. This in turn may provide more space for components within EMI shield 310 and allow for a reduction in the overall shape of electronic device 300.

Cover 330 may include several features to ensure that cover 330 remains in contact with stepped return 326 despite not having snaps 334 engaging frame 320 along the associated edge of cover 330. For example, cover 330 may include cantilever springs 336 extending from surface 332. To provide sufficient force to the edges of cover 330 that do not include snaps 334, spring 336 may be positioned near or adjacent to the portion of surface 330 in contact with stepped return 326. Spring 336 may include a cantilever extending from opening 337 in surface 332 (e.g., material from surface 332 remaining after opening 337 was formed), or may instead include a cantilever coupled to a complete surface 332 (e.g., additional material coupled to surface 332). Spring 336 may be biased away from circuit board 304 so that when housing 302 is assembled over circuit board 304 and EMI shield 310, spring 336 may be in contact with and resist housing 302, thus forcing cover 330 against frame 320. Spring 336 may include an emboss or other feature 336A at the free end of the spring to increase the contact surface between spring 336 and housing 302. If spring 336 is constructed from the same material as cover 330, or is otherwise conductive, spring 336 may serve as a ground for EMI shield 310.

Cover 330 may include emboss 338 constituting a canyon parallel or substantially parallel to the edge of cover 330 that does not include snaps 334 (e.g., the edge configured to be placed in contact with stepped return 326). Because emboss 338 may change the amount of material along the edge of surface 332, emboss 338 may be operative to distribute the force provided by the contact between spring 336 and housing 302 along the entire edge of cover 330. In some embodiments, emboss 338 may be designed or shaped to distribute the force evenly or to maximize the force in one or more desired locations (e.g., at grounding points 339, described below) using any suitable mechanical feature (e.g., a flange, chamfer, detent, bevel, or a fillet).

To further ensure that cover 330 remains in contact with frame 320 along stepped return 326, and to further ensure that proper electrical contact is maintained to sufficiently ground each portion of EMI shield 310, cover 330 may include one or more grounding points 339 along the portion of surface 332 that is placed in contact with stepped return 326. In some embodiments, grounding points 339 may include one or more embossed features operative to contact return 326. Grounding points 326 may be positioned and sized using any suitable approach, including for example to align with indentations 329 (e.g., such that grounding points 339 extend at least partially into indentations 329). Spring 336, emboss 338 and grounding points 339 may be positioned and sized such that a maximum amount of force generated by the contact between spring 336 and housing 302 is transferred to grounding points 339, thus ensuring that grounding points 339 and indentations 329 remain in contact, thus grounding the associated edge of EMI shield 300.

Frame 320 and cover 330 may be manufactured from any suitable material operative to shield the components of contained within EMI shield 310 from electromagnetic interference (e.g., from other components of the electronic device). In some embodiments, shield 310 may be constructed from an electrically conductive material such as, for example, metal (e.g., copper, silver, aluminum, steel), graphite, plasma, or any other conductive material. Frame 320 and cover 330 may include unbroken surfaces, or materials with a mesh or holes (e.g., so long as the holes are smaller than the wavelength of the radiation being kept out).

Figure 4:
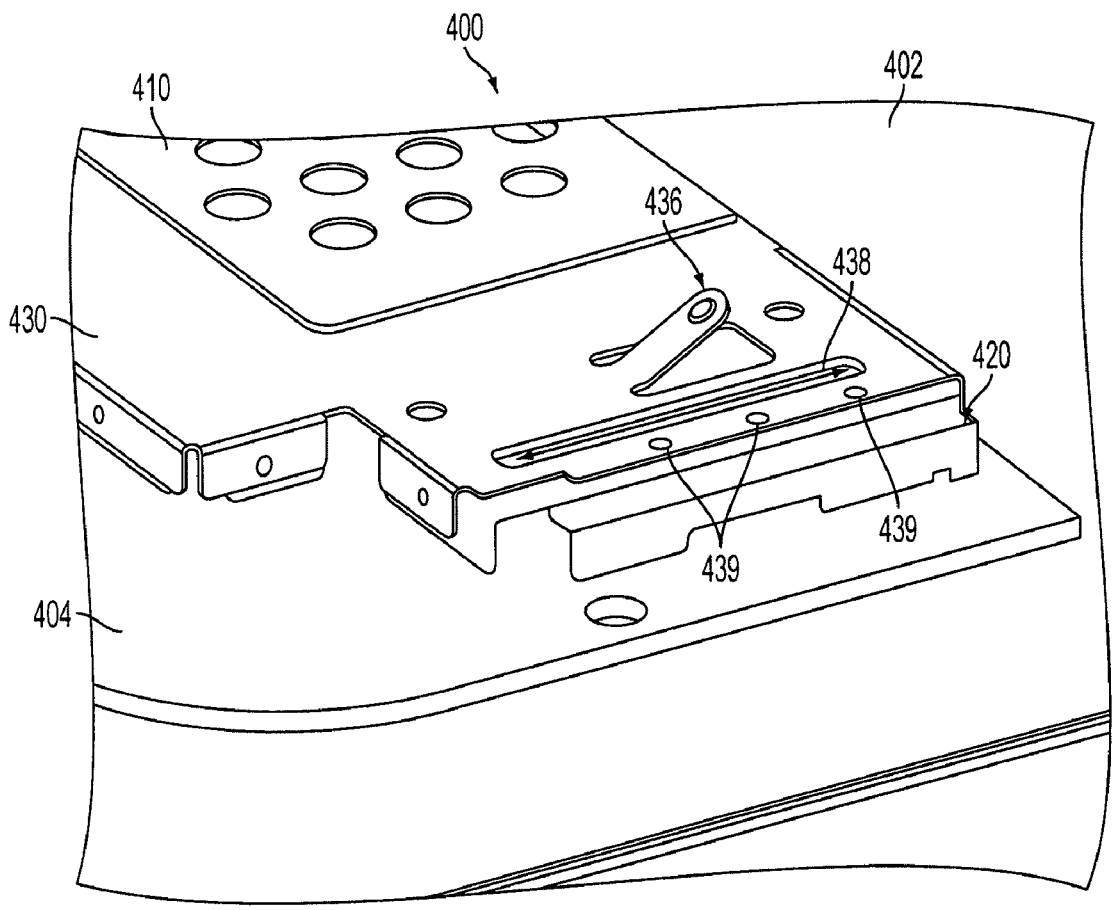
FIG. 4 is a schematic view of the assembled electronic device of FIG. 3 in accordance with one embodiment of the invention.

FIG. 4 is a schematic view of the assembled electronic device of FIG. 3 in accordance with one embodiment of the invention. Electronic device 400 may include housing 402, circuit board 404 and EMI shield 410, which may include some or all of the features of housing 302, circuit board 304 and EMI shield 310 of electronic device 300 (FIG. 3). EMI shield 410 may further include frame 420 and cover 430, which may further include spring 436, emboss 438 and grounding points 439, which may include some or all of the features of frame 320, cover 330, spring 336, emboss 338 and grounding points 339 of EMI shield 310 (FIG. 3). The transparent display of housing 402 indicates the contact between spring 436 and housing 402.

Figure 5:
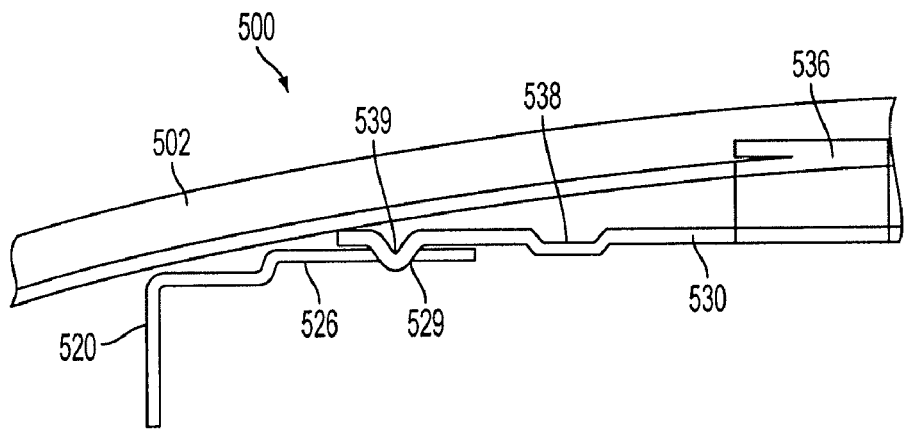
FIG. 5 is a cross-sectional view of the assembled electronic device of FIG. 3 in accordance with one embodiment of the invention.

FIG. 5 is a cross-sectional view of the assembled electronic device of FIG. 3 in accordance with one embodiment of the invention. Electronic device 500 may include housing 502 and EMI shield 510, which may include some or all of the features of housing 302 and EMI shield 310 of electronic device 300 (FIG. 3). EMI shield 510 may further include frame 520 and cover 530, which may further include stepped return 526, indentation 529, spring 536, emboss 538 and grounding points 539, which may include some or all of the features of frame 320, cover 330, stepped return 326, indentation 329, spring 336, emboss 338 and grounding points 339 of EMI shield 310 (FIG. 3). As clearly shown in FIG. 5, spring 536 may be in contact with housing 502 while grounding point 539 is in contact with indentation 529 of stepped return 526.

The above described embodiments of the present invention are presented for purposes of illustration and not of limitation, and the present invention is limited only by the claims which follow.

What is claimed is:

1. An electromagnetic interference shield, comprising:
    a frame comprising:
        a side wall;
        a return extending substantially perpendicular to the side wall, the return extending from the top edge of a first portion of the wall; and
        a stepped return extending vertically from the top edge of a second portion of the wall, the stepped return comprising at least two returns extending substantially perpendicular from the wall, the at least two returns at different heights relative to the bottom of the wall; and
    a cover operative to be placed over the frame, the cover comprising:
        a planar surface extending over a portion of the return and a portion of the stepped return; and
        at least one snap extending vertically from the planar surface and operative to engage the first portion of the wall, wherein no snap engages the second portion of the wall.

2. The electromagnetic interference shield of claim 1, wherein:
the frame defines an enclosure; and
the return and the stepped return extend vertically substantially perpendicular from of the wall into the defined enclosure.

3. The electromagnetic interference shield of claim 1, wherein the stepped return further comprises a plurality of offset returns, each of the plurality of offset returns positioned at different heights relative to the bottom of the side wall.

4. The electromagnetic interference shield of claim 3, wherein the distance of the edge nearest the side wall of each of the plurality of offset returns from the wall is different.

5. The electromagnetic interference shield of claim 1, wherein the cover further comprises at least one cantilever spring extending from the planar surface and operative to contact an electronic device component.

6. The electromagnetic interference shield of claim 5, wherein the cantilever spring is operative to provide a force pressing the cover against the frame in response to contacting the electronic device component.

7. The electromagnetic interference shield of claim 5, wherein the electronic device component is a housing.

8. The electromagnetic interference shield of claim 1, wherein the cover further comprises at least one embossed grounding point operative to be placed in contact with a portion of the stepped return.

9. The electromagnetic interference shield of claim 8, wherein the cover further comprises at least one cantilever spring extending from the planar surface and operative to provide a force pressing the cover against the frame by contacting an electronic device component.

10. The electromagnetic interference shield of claim 9, wherein the cover further comprises an emboss feature operative to distribute the force to the at least one grounding point.

11. The electromagnetic interference shield of claim 8, wherein the portion of the stepped return comprises at least one indentation operative to receive the at least one embossed grounding point.

12. An electronic device, comprising:
a housing operative to receive electronic device components;
a circuit board comprising at least one component; and
an EMI shield for protecting the at least one component, comprising:
a frame coupled to the circuit board and enclosing the at least one component, the frame comprising a wall and at least one stepped return, wherein the stepped return comprises a plurality of returns extending over the portion of the circuit board enclosed by the frame and at different heights from the circuit board; and
a cover operative to be coupled to the frame, the cover comprising at least one snap operative to engage the wall, wherein no snap extends from the portion of the cover placed adjacent to the at least one stepped return.

13. The electronic device of claim 12, wherein the height from the circuit board of one of the plurality of returns is less than the height from the circuit board of the plurality of returns positioned at a larger distance from the frame wall.

14. The electronic device of claim 12, wherein the cover further comprises at least one spring extending from the surface of the cover, the spring operative to contact the housing when the electronic device is assembled.

15. The electronic device of claim 14, wherein the cover comprises an emboss operative to distribute the force generated by the contact between the spring and the cover to the portion of the cover placed adjacent to the at least one stepped return.

16. The electronic device of claim 15, wherein the cover further comprises at least one grounding point operative to contact the at least one stepped return.

17. The electronic device of claim 16, wherein the emboss is operative to distribute the force to the at least one grounding point.

18. A method for assembling an EMI shield, comprising:
coupling a frame defining an enclosure having a plurality of sides to a circuit board, the frame comprising a wall and a stepped return extending from the top surface of the wall into the enclosure, the stepped return comprising a plurality of returns extending over the portion of the circuit board enclosed by the frame and at different heights from the circuit board;
engaging a cover with the frame, the cover comprising a planar surface and at least one snap operative to engage the wall, wherein the wall of the at least one side of the enclosure is not engaged by any snaps; and
placing a housing over the cover, wherein the housing is operative to contact a spring extending from the cover and operative to press the cover against the return adjacent to the wall of the at least one side of the enclosure that is not engaged by any snaps.

19. The method of claim 18, wherein the return adjacent to the wall of the at least one side of the enclosure that is not engaged by any snaps comprises a stepped return.

* * * * *